United States Patent [19]

Fusco et al.

[11] Patent Number: 4,600,469

[45] Date of Patent: Jul. 15, 1986

[54] METHOD FOR POLISHING DETECTOR MATERIAL

[75] Inventors: Albert J. Fusco, East Boston; Bruce C. Cochran, Lexington, both of Mass.

[73] Assignee: Honeywell Inc., Minneapolis, Minn.

[21] Appl. No.: 684,894

[22] Filed: Dec. 21, 1984

[51] Int. Cl.[4] .................... H01L 21/306; B44C 1/22; C03C 15/00; C23F 1/00
[52] U.S. Cl. ................................. 156/636; 156/639; 156/645; 156/651; 156/903; 156/345; 252/79.1
[58] Field of Search ............................. 156/636–639, 156/645, 650, 651, 662, 903, 345; 252/79.1; 427/82

[56] References Cited

U.S. PATENT DOCUMENTS

| 4,184,908 | 1/1980 | Lackner et al. | 156/636 |
| 4,323,422 | 4/1982 | Calawa et al. | 156/636 |
| 4,436,580 | 3/1984 | Boyd et al. | 156/636 |
| 4,475,981 | 10/1984 | Rea | 156/636 |

Primary Examiner—William A. Powell
Attorney, Agent, or Firm—John S. Solakian; Albin Medved

[57] ABSTRACT

A method for chemically-mechanically polishing detector material such as mercury cadmium telluride (HgCdTe) to obtain damage free surfaces. The polishing system includes a potassium-iodine iodide in a deionized water base, in combination with an inert lubricant, such as ethylene glycol, and a semisoft porous polishing pad made from, for example, an expanded polyurethane material.

16 Claims, 1 Drawing Figure

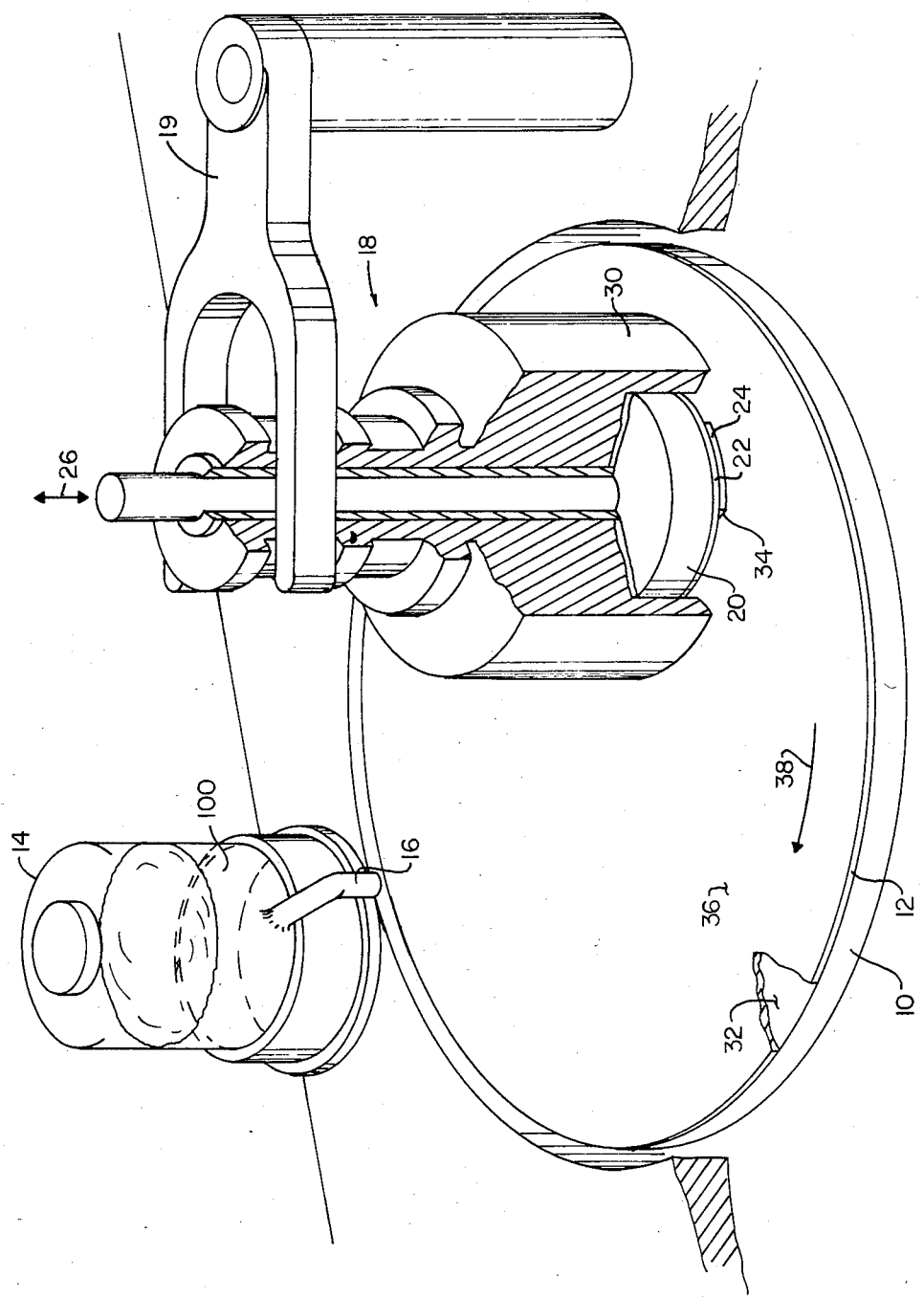

4,600,469

METHOD FOR POLISHING DETECTOR MATERIAL

BACKGROUND OF THE INVENTION

The Government has rights in this invention pursuant to Contract No. F33615-82-C-5085 awarded by the Department of the Air Force.

The present invention relates to methods for polishing detector material and more particularly mercury cadmium telluride (HgCdTe) surfaces.

Semiconductor devices, such as photodiode or photovoltaic detector arrays, are often fabricated from crystalline or epitaxial growths of mercury cadmium telluride (HgCdTe) which have been cut into or grown onto wafer substrates. In order to construct these detectors, the surface of the HgCdTe wafer must be free of contaminants, mechanical damage, and be planar to within 2 microns.

The surface characteristics of the wafer are critical, and effect device yields and performance in a number of ways. First, surface irregularities may affect the ability to delineate the detector elements through photolithographic, or other well-known processes. Second, surface irregularities and contaminants may affect the ability to diffuse known amounts of impurities into the wafer during final construction, and can affect the quality of the finished optical device by producing nonuniform detector responsivities and poor interconnection with the carrier board or a charge coupled device.

In the past, HgCdTe wafers have been mechanically polished to within a desired tolerance of final thickness using a series of grit polishes, culminating with a very fine alumina polish. This process has then been followed by dipping the substrate in an etchant, such as bromine, to remove remaining impurities and to take the wafer to final thickness. This two-step process produces several undesirable results. First, the extensive use of the mechanical polish tends to disturb the subsurface crystal structure, reducing finished detector yield or degrading detector quality. In order to remove the zone of superficial destruction, the chemical etchant often must be used for relatively prolonged periods. Extended use of the etchant will round the edges of the wafer and reduce surface planarity, a result which the entire process seeks to minimize.

It is well-known that superior surface qualities may be obtained on cadmium telluride (CdTe) using a chemical-mechanical polishing process, as described in U.S. Pat. No. 3,869,324, entitled "Method of Polishing Cadmium Telluride." Such prior art process suggests the use of a water soluble alkali metal or alkaline earth metal hypohalite and an alkali metal carbonate as a chemical polishing solution which is used in combination with a mechanical polishing action. However, the use of such solution on HgCdTe is undesirable because the humidity of the work area must be closely controlled to avoid unpredictable etchrates, and because materials in this chemical family tend to be extremely flammable and therefore constitute a safety hazard.

It is also known that HgCdTe may be etched using a variety of solutions, including, for example, bromine methanol as described by J. V. Gormley, M. J. Manfra and A. R. Calawa in an article entitled "Hydroplane Polishing of Semiconductor Crystals," Rev. Sci. Instrum., Volume 52, No. 8, p. 1256, August, 1981. However, bromine methanol, even in dilute solutions, tends to remove material too quickly, resulting in rounded edges, lack of planarity and unpredictable material removal.

Similarly, the inventors of the present invention experimented with a variety of other known semiconductor etchants, for example, solutions of potassium dichromate ($K_2Cr_2O_2$) and potassium hydroxide (KOH). These either acted too slowly or resulted in formation of an oxide layer or stain on the HgCdTe surface.

It is, accordingly, a primary object of the present invention to provide an improved method for polishing detector material surfaces, such as HgCdTe surfaces, to improve surface planarity and to minimize surface irregularities and defects.

SUMMARY OF THE INVENTION

The above and other objects of the present invention are provided by chemically-mechanically polishing the detector material surface using an aqueous solution of $KI.I_2$ (a well-known gold etchant), deionized water and a lubricant, such as ethylene glycol, in combination with a porous polishing pad. For polishing HgCdTe detector material, the etchant causes oxidation of the HgCdTe surface, which is "scraped" off by the porous polishing pad, leaving a finished surface almost as contaminant free as that obtained by etching alone, but with greatly improved surface planarity and polish. The planarity of the finished surface is, in part, a function of the flatness and rigidity of the polishing pad and underlying support and may be altered to suit the application.

BRIEF DESCRIPTION OF THE DRAWING

The objects of the present invention are achieved with respect to the illustrative embodiment and the sole FIG. 1 which shows a conventional polishing apparatus used in conjunction with the method of the present invention.

DETAILED DESCRIPTION OF THE PREFERRED EMBODIMENT(S)

The chemical-mechanical method of the present invention may be used for detector material and more particularly any form or type of HGCdTe crystal or growth, so long as a substantially planar surface to be polished is presented. Generally, ingots of crystalline HgCdTe are grown and sliced into wafers, or the material may be grown epitaxially on a crystalline substrate in essentially wafer form. These wafers are, in turn, mounted on carrier substrates for polishing to remove surface defects and to obtain desired device thickness.

The polishing apparatus used in conjunction with the present invention might be any of a number of conventionally available machines, for example, such as that described by Regh et al. in U.S. Pat. No. 3,436,259, or a polishing machine, Model PM-2CH, manufactured by the Logitech Corporation of Dunbarton, Scotland. A schematic view of such a machine is shown in FIG. 1, although use of the present invention is not limited in any way to use in conjunction with this particular apparatus.

Referring to FIG. 1, a sample polishing apparatus includes a plate 10, a polishing pad 12 affixed to plate 10 as shown, a fluid reservoir 14 with outlet 16 over plate 10, and a substrate holder apparatus 18 constrained relative to plate 10 by reciprocating arm 19. Holder apparatus 18 may include a chuck 20 which holds carrier 22 and HgCdTe substrate or wafer 24, all of which may move perpendicular to plate 10 with respect to sleeve 30 as shown by direction arrow 26. Plate 10 is affixed to a motor (not shown) which provides for substantially horizontal rotation with respect to surface 36 of pad 12 as shown by arrow 38.

As plate 10 moves, the etchant solution 100 of the present invention is brought in contact with surface 34 of wafer 24, as well as surface 36, by controlled flow through outlet 16 from reservoir 14. Alternatively, a spray dispenser apparatus (not shown) may be used to wet pad 12 and wafer 24. The chemical-mechanical polish of wafer 24 is accomplished by the relative motion of plate 10 with respect to wafer 24 in combination with the etchant action of solution 100.

Etchant 100 includes a $KI.I_2$ gold etchant in a substantially 1:1 solution with deionized water. If necessary, an inert material, such as ethylene glycol, may be applied liberally to surface 32 of pad 10 to act as a lubricant. Generally, surface 38 of plate 10 is polished to the required flatness of wafer 24. The amount of potassium-iodine present in etchant 100 may be varied somewhat while still maintaining material removal without significant reduction in surface planarity, or other unexpected results. For example, a 100% solution of potassium-iodine iodide has been shown to result in high surface irregularity, like that obtained by use of strong etchants acting alone. This effect, often described as "orange peel", is well-known in the prior art. Solutions of less than fifty percent (50%) concentration result in very slow rates of removal. This has been found to be unacceptable in a production environment. Potassium-iodide may be obtained from the Transene Company, Burlington, Mass., under the trade name of Transene Gold Etch Type TFA.

The composition of pad 12 used in combination with etchant 100 is critical to the final finish obtained on wafer 24. Pad 12 must have several qualities. First, it must be relatively porous in order to provide enough cutting edges to effect reasonable removal of the HgCdTe material. Generally, it must not be too rigid or abrasive, otherwise it will introduce scratches on the surface of the wafer by its own operation. Second, it should have a relatively short nap so that the edges of the wafer are not rounded by the polishing process.

Pad 12 may comprise any number of semiporous, relatively rigid, low nap materials which may be applied to surface 38 such that surface 36 will not deviate substantially from the desired surface planarity. As an example, pad 12 may comprise an expanded polyurethane material, such as Collussus LP-57, manufactured by James H. Rhodes and Company, Inc. of Franklin Springs, N.Y. Other possible surfaces include Suba Model H series pads manufactured by the Rodel Products Corp., Scottsdale, Ariz.

The rate of flow of etchant 100 over pad 12 is not critical to the success of the method of the present invention, as long as pad 12 is kept saturated with etchant 100. Typically, plate 10 moves at a speed to produce a surface speed at wafer 24 of approximately 180 inches per minute. A relatively light pressure, for example 150 to 750 grams per square inch, may be placed on wafer 24 in order to insure contact with pad 12 and an adequate rate of material removal. It is understood that these speeds and pressures may be varied significantly, depending on the rate of removal desired, and the type of material selected for pad 12 and the type of detector material being polished. The use of the suggested pressure and plate speed, in combination with use of a Collussus LP-57 pad and 1:1 solution of etchant 100, results in a removal rate of approximately one (1) micron per minute.

Having described the invention, what is new and novel and for which it is desired to obtain Letters Patent is:

We claim:

1. A method for the chemical-mechanical polishing of the surface of detector material to a high degree of planarity and surface quality, said method comprising the steps of:
    A. maintaining said material surface continuously wet with an excess quantity of an aqueous solution comprising potassium-iodine iodide in deionized water; and
    B. continuously wiping said material surface with a firm surface, using moderate pressure, while maintaining a relative movement between said material surface and said firm surface in order to remove material from the high points of said material surface.

2. A method as in claim 1 wherein said detector material is mercury cadmium telluride (HgCdTe).

3. A method as in claim 2 wherein said potassium-iodine iodide concentration in said deionized water is approximately fifty percent (50%).

4. A method as in claim 3 wherein said moderate pressure is between 150 and 300 grams per square inch of said material surface.

5. A method as in claim 3 wherein said relative movement between said material surface and said firm surface occurs at a rate of approximately 180 inches per minute.

6. A method as in claim 2 wherein said firm surface further comprises a semiporous, stiff, low-nap, low abrasive material.

7. A method as in claim 2 wherein said firm surface comprises an expanded polyurethane pad.

8. A method as in claim 2 wherein said method further comprises the step of thoroughly wetting said pad with ethylene glycol, as well as said aqueous solution.

9. A method as in claim 1 wherein said detector material is monocrystalline.

10. A method as in claim 1 wherein said detector material is polycrystalline.

11. A method for the chemical-mechanical polishing of mercury cadmium telluride (HgCdTe) surface to a high degree of planarity and surface quality, said method comprising the steps of:
    A. maintaining said HgCdTe surface continuously wet with an excess quantity of an aqueous solution comprising potassium-iodine iodide in deionized water, wherein said potassium-iodine iodide concentration in said deionized water is selected to provide optimum removal rate while maintaining surface quality; and
    B. continuously wiping said HgCdTe surface with a firm surface, using moderate pressure, while maintaining a relative movement between said HgCdTe surface and said firm surface in order to remove HgCdTe material from the high points of said HgCdTe surface.

12. A method as in claim 11 wherein said moderate pressure is between 150 and 300 grams per square inch of said material surface.

13. A method as in claim 15 wherein said firm surface further comprises a semiporous, stiff, low-nap, low abrasive material.

14. A method as in claim 11 wherein said firm surface comprises an expanded polyurethane pad.

15. A method as in claim 11 wherein said method further comprises the step of thoroughly wetting said pad with ethylene glycol, as well as said aqueous solution.

16. A method as in claim 11 wherein said concentration of potassium-iodine iodide in said deionized water is approximately fifty percent (50%).

* * * * *